(12) United States Patent
Ha et al.

(10) Patent No.: US 11,729,913 B2
(45) Date of Patent: *Aug. 15, 2023

(54) DISPLAY DEVICE

(71) Applicant: SAMSUNG DISPLAY CO., LTD., Yongin-si (KR)

(72) Inventors: Seung Hwa Ha, Hwaseong-si (KR); Ja Seung Ku, Seoul (KR); Seung-Ho Jung, Hwaseong-si (KR); In-Woo Jeong, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,317

(22) Filed: Jun. 28, 2022

(65) Prior Publication Data

US 2022/0338351 A1 Oct. 20, 2022

Related U.S. Application Data

(62) Division of application No. 16/943,502, filed on Jul. 30, 2020, now Pat. No. 11,412,614.

(30) Foreign Application Priority Data

Feb. 13, 2020 (KR) .................. 10-2020-0017579

(51) Int. Cl.
*H05K 1/14* (2006.01)
*H01L 23/498* (2006.01)
(Continued)

(52) U.S. Cl.
CPC .......... *H05K 1/147* (2013.01); *H01L 23/4985* (2013.01); *H05K 1/0281* (2013.01);
(Continued)

(58) Field of Classification Search
CPC ...... H05K 1/147; H05K 1/0281; H05K 1/189; H05K 2201/10128; H05K 2201/2009;
(Continued)

(56) References Cited

U.S. PATENT DOCUMENTS 9,829,924 B2 11/2017 Shin et al.
10,082,839 B1 * 9/2018 Turchin ............... H05K 5/0017
(Continued)

FOREIGN PATENT DOCUMENTS

JP 6315261 4/2018
KR 10-2013-0112570 10/2013
(Continued)

OTHER PUBLICATIONS

European Search Report dated Jun. 8, 2021 in corresponding European Patent Application No. 20209326.6 (15 pages).

*Primary Examiner* — Hoa C Nguyen
(74) *Attorney, Agent, or Firm* — F. Chau & Associates, LLC

(57) ABSTRACT

A display device includes a display panel including a front surface and a rear surface, a first circuit board electrically connected to a first side of the display panel, a second circuit board electrically connected to a second side opposite to the first side of the display panel, a third circuit board disposed on the rear surface and electrically connected to the first circuit board and the second circuit board, the third circuit board extending in a first direction, and a support plate disposed on the rear surface. The display panel is foldable along a folding line extending in a second direction. The support plate has a first opening extending along the folding line, and an opening pattern near a portion of the first opening. The third circuit board overlaps the portion of the first opening. The opening pattern includes slits and the third circuit board overlaps the slits.

8 Claims, 26 Drawing Sheets

(51) Int. Cl.
*H05K 1/02* (2006.01)
*H05K 1/18* (2006.01)
*H01L 27/15* (2006.01)
*H10K 59/131* (2023.01)

(52) U.S. Cl.
CPC .............. *H05K 1/189* (2013.01); *H01L 27/15* (2013.01); *H05K 2201/10128* (2013.01); *H05K 2201/2009* (2013.01); *H10K 59/131* (2023.02)

(58) Field of Classification Search
CPC .. H01L 23/4985; H01L 27/15; H01L 27/3276
See application file for complete search history.

(56) References Cited

U.S. PATENT DOCUMENTS

| | | | | |
|---|---|---|---|---|
| 10,164,208 | B2* | 12/2018 | Lee | H01L 51/5253 |
| 10,575,415 | B2* | 2/2020 | Shin | H04N 5/64 |
| 10,642,313 | B1* | 5/2020 | Wu | G06V 40/1306 |
| 2012/0307423 | A1* | 12/2012 | Bohn | H04M 1/0216 |
| | | | | 361/679.01 |
| 2016/0299532 | A1* | 10/2016 | Gheorghiu | E05D 11/0054 |
| 2017/0062485 | A1* | 3/2017 | Kwon | H01L 27/3276 |
| 2018/0097197 | A1 | 4/2018 | Han et al. | |
| 2018/0145269 | A1* | 5/2018 | Myeong | H01L 51/0097 |
| 2018/0190936 | A1* | 7/2018 | Lee | B32B 15/04 |
| 2018/0192527 | A1 | 7/2018 | Yun et al. | |
| 2019/0196543 | A1* | 6/2019 | Mizoguchi | G06F 1/1626 |
| 2019/0196548 | A1* | 6/2019 | Kim | G09F 9/301 |
| 2020/0042042 | A1* | 2/2020 | Park | G06F 1/1641 |
| 2020/0117034 | A1* | 4/2020 | Yin | G02F 1/1339 |
| 2021/0259110 | A1 | 8/2021 | Ha et al. | |

FOREIGN PATENT DOCUMENTS

| | | |
|---|---|---|
| KR | 10-2014-0106014 | 9/2014 |
| KR | 10-2019-0080740 | 7/2019 |
| KR | 10-2019-0124844 | 11/2019 |

* cited by examiner

DISPLAY DEVICE

CROSS-REFERENCE TO RELATED APPLICATION

This application is a divisional of U.S. application Ser. No. 16/943,502 filed on Jul. 30, 2020 which claims priority to and the benefit of Korean Patent Application No. 10-2020-0017579 filed in the Korean Intellectual Property Office on Feb. 13, 2020, the entire contents of which are incorporated by reference herein.

BACKGROUND

(a) Technical Field

The present disclosure relates to a display device. More particularly, the present disclosure relates to a display device including a foldable display panel.

(b) Description of the Related Art

A display device such as a liquid crystal display (LCD), an organic light emitting diode (OLED) display, etc. includes a display panel including a plurality of pixels that can display an image. Each pixel includes a pixel electrode for receiving a data signal, and the pixel electrode is connected to at least one transistor to receive the data signal.

Recently, a deformable display device in which a display panel may be bent or folded (i.e., bendable or foldable) for its shape to be deformed has been developed.

The above information disclosed in this Background section is only for enhancement of understanding of the background of the invention, and therefore it may contain information that does not form the prior art that is already known in this country to a person of ordinary skill in the art.

SUMMARY

The present disclosure has been made in an effort to provide a display device that may have improved reliability by preventing a defect caused by deformation of the display device from occurring in a circuit board included in a deformable display device that may be bent or folded.

According to an exemplary embodiment of the present invention, a display device includes a display panel including a front surface and a rear surface opposite to each other, a first circuit board electrically connected to a first side of the display panel, a second circuit board electrically connected to a second side opposite to the first side of the display panel, a third circuit board disposed on the rear surface of the display panel and electrically connected to the first circuit board and the second circuit board, the third circuit board extending in a first direction, and a support plate disposed on the rear surface of the display panel. The display panel is foldable along a folding line extending in a second direction crossing the first direction. The support plate has a first opening extending along the folding line, and an opening pattern near a portion of the first opening. The third circuit board overlaps the portion of the first opening. The opening pattern includes a plurality of slits and the third circuit board overlaps the plurality of slits.

The plurality of slits are spaced apart from each other in the first direction.

The display device further includes an adhesive layer disposed between the third circuit board and the support plate.

A width of the second direction of the third circuit board is smaller than or equal to a width of the second direction of a pattern area of the support plate on which the plurality of slits are disposed.

The opening pattern further includes a first vertical opening extending in the first direction along a first edge of the pattern area, and a second vertical opening extending in the first direction along a second edge opposite to the first edge. A distance of the second direction between an edge of the third circuit board and an edge of the first vertical opening is 0 mm or more. The edge of the third circuit board and the edge of the first vertical opening are closer to the first edge of the pattern area than a second edge, opposite to the first edge, of the pattern area.

A width of the third circuit board in the second direction is greater than a width of the second direction of a pattern area of the support plate on which the plurality of slits are disposed.

The opening pattern further includes a vertical opening extending in the first direction along an edge of the pattern area, and the third circuit board overlaps the vertical opening.

The support plate further includes a horizontal opening spaced in the first direction apart from a pattern area of the support plate on which the plurality of slits are disposed. The horizontal opening extends in the second direction. The third circuit board passes through the horizontal opening.

A portion of the third circuit board overlapping the pattern area of the support plate is disposed between the support plate and the display panel.

The support plate may include metal, and the third circuit board may be flexible.

The support plate includes a first surface facing the display panel and a second surface opposite to the first surface, the support plate may have a hole provided in the second surface, the third circuit board and the hole may extend in the first direction, and the third circuit board may be disposed in the hole.

The plurality of slits are adjacent to the hole in a thickness direction of the support plate.

According to an exemplary embodiment of the present invention, a display device includes a display panel including a front surface and a rear surface opposite to each other, a first circuit board electrically connected to a first side of the display panel, a second circuit board electrically connected to a second side opposite to the first side of the display panel, a third circuit board disposed on the rear surface of the display panel and electrically connected to the first circuit board and the second circuit board, the third circuit board extending in a first direction, a support plate disposed on the rear surface of the display panel, the display panel being foldable along a folding line extending in a second direction crossing the first direction, the support plate having a first opening extending along the folding line, and a second opening near a portion of the first opening, and the third circuit board overlapping the portion of the first opening, and a cushion disposed in the second opening. The third circuit board overlaps the cushion.

An upper surface of the cushion is higher than an upper surface of the support plate.

A distance of the second direction between an edge extending in the first direction of the third circuit board and a first edge extending in the first direction of the second opening is greater than a distance of the second direction between an edge extending in the first direction of the cushion and the first edge of the second opening of the support plate. The edge of the third circuit board and the edge of the cushion are closer to the first edge of the second opening than a second edge, opposite to the first edge, of the second opening.

According to an exemplary embodiment of the present invention, a display device includes a display panel including a front surface and a rear surface opposite to each other, a first circuit board electrically connected to a first side of the display panel, a second circuit board electrically connected to a second side opposite to the first side of the display panel, a third circuit board disposed on the rear surface of the display panel and electrically connected to the first circuit board and the second circuit board, the third circuit board extending in a first direction, and a support plate disposed on the rear surface of the display panel. The display panel is foldable along a folding line extending in a second direction crossing the first direction. The support plate includes a first surface and a second surface opposite to each other. The support plate has a hole formed on the first surface and extending in the first direction. The third circuit board is disposed in the hole.

The display panel is closer to the second surface of the support plate than the first surface of the support plate.

The support plate has an opening disposed closer to the second surface of the support plate, and the opening of the support plate is adjacent to the hole of the support plate in a thickness direction of the support plate.

The opening of the support plate is connected to the hole of the support plate, and the third circuit board passes through the opening.

The third circuit board disposed in the hole of the support plate may cross the folding line.

According to the embodiments of the present disclosure, it is possible to increase reliability of a display device by preventing a defect caused by deformation of the display device from occurring in a circuit board included in a deformable display device that may be bent or folded.

DETAILED DESCRIPTION OF THE EMBODIMENTS

Figure 1:
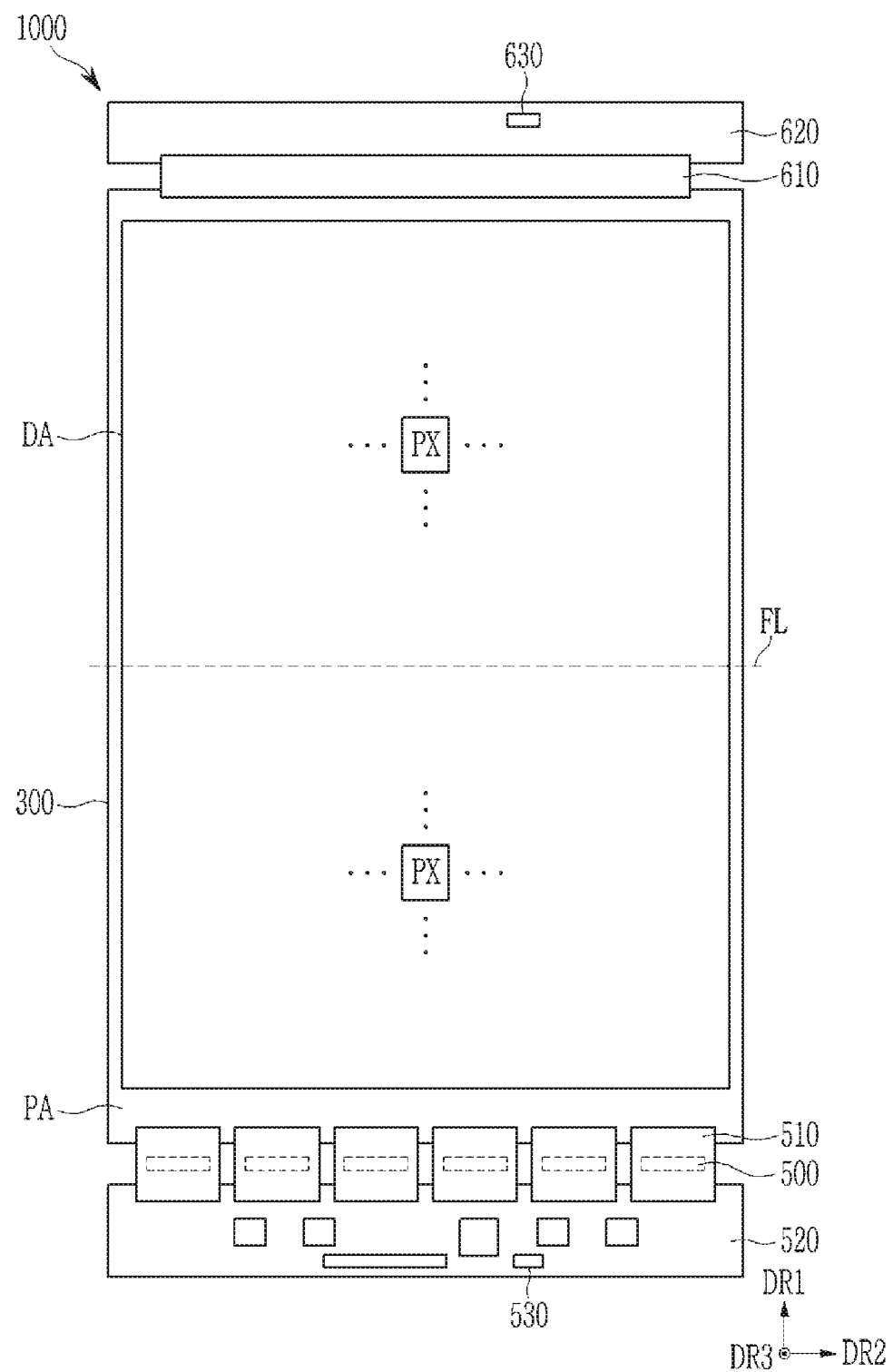
FIG. 1 illustrates a top plan view of a front surface of a display device in a state in which the display device is unfolded according to an exemplary embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, areas, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means that an element is disposed on or below another element, and does not necessarily mean that the element is disposed on the upper side of another element based on a gravitational direction.

In addition, unless explicitly described to the contrary, the word "comprise" and variations such as "comprises" or "comprising" will be understood to imply the inclusion of stated elements but not the exclusion of any other elements.

Throughout this specification, a plan view means a view when observing a surface parallel to two directions (e.g., a first direction DR1 and a second direction DR2) crossing each other, and a cross-sectional view means a view when observing a surface cut in a direction (e.g., a third direction) perpendicular to the surface parallel to the first direction DR1 and the second direction DR2. Also, to overlap two constituent elements means that two constituent elements are overlapped in the third direction (e.g., a direction perpendicular to an upper surface of the substrate) unless stated otherwise.

First, a display device according to an embodiment of the present invention will be described with reference to FIG. 1 to FIG. 7.

Figure 2:
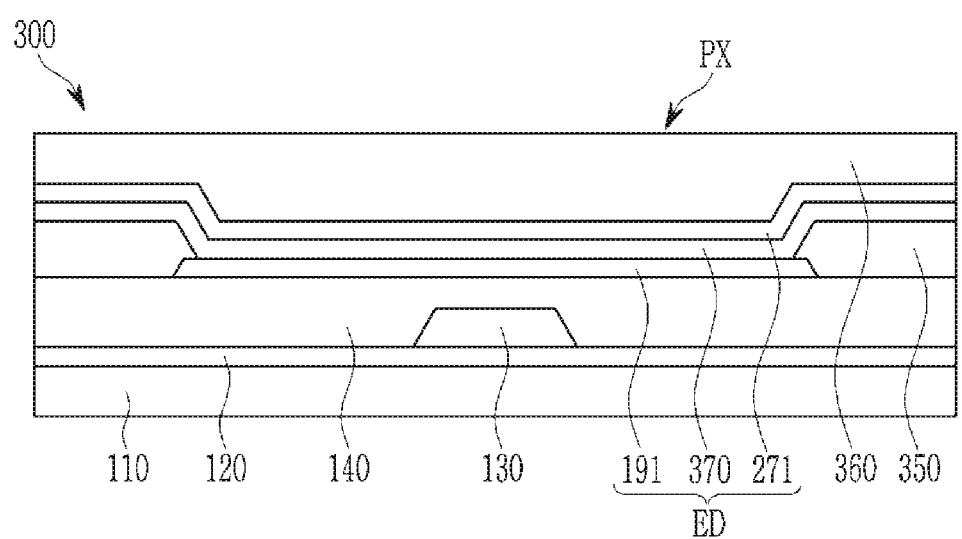
FIG. 2 illustrates a cross-sectional view of one pixel of a display device according to an exemplary embodiment of the present invention.
Figure 3:
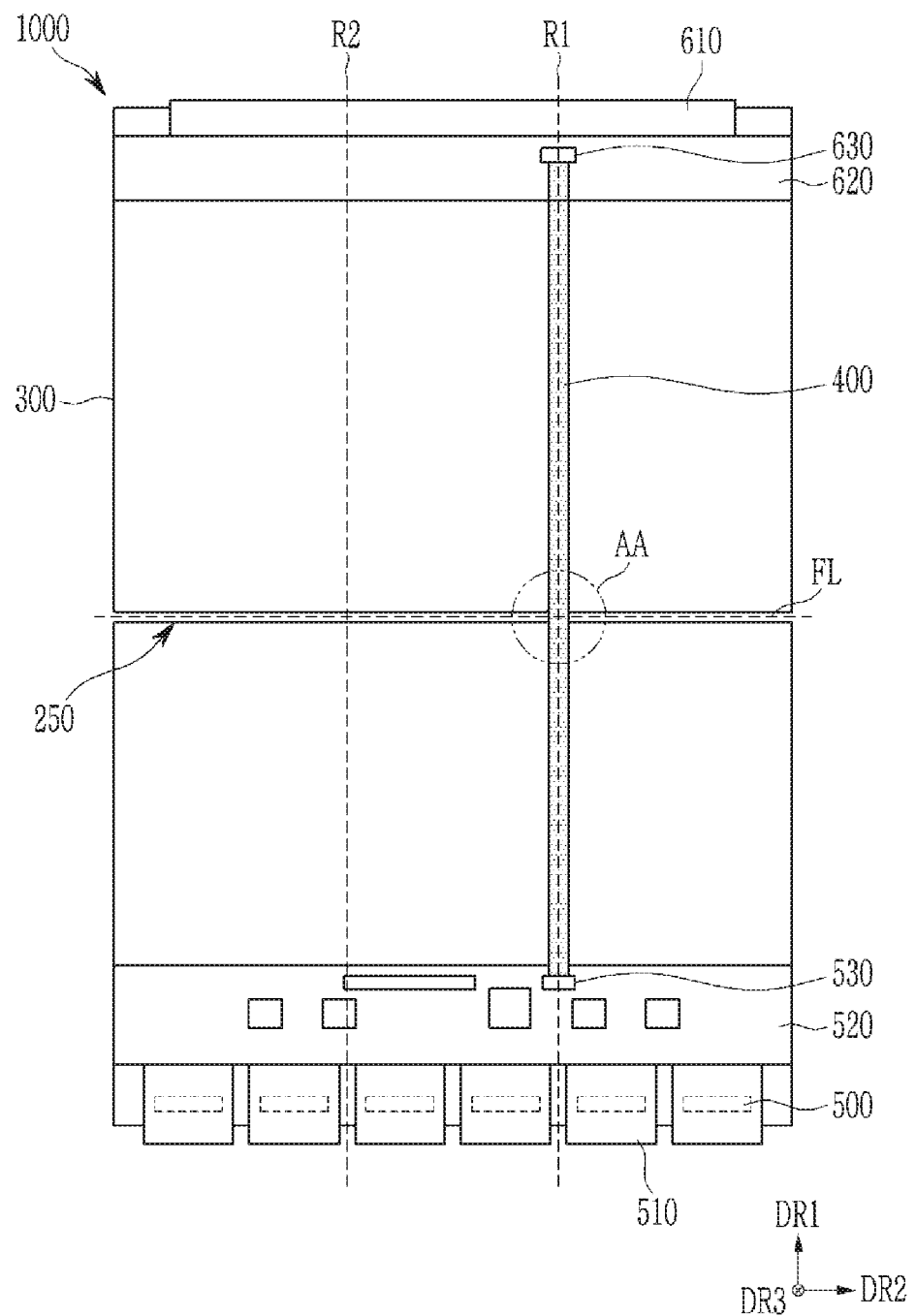
FIG. 3 illustrates a top plan view of a rear surface of a display device in a state in which the display device is unfolded according to an exemplary embodiment of the present invention.

FIG. 1 illustrates a top plan view of a front surface of a display device in a state in which the display device is unfolded according to an embodiment of the present invention, FIG. 2 illustrates a cross-sectional view of one pixel of a display device according to an embodiment of the present invention, and FIG. 3 illustrates a top plan view of a rear surface of a display device in a state in which the display device is unfolded according to an embodiment of the present invention.

Referring to FIG. 1, a display device 1000 according to an embodiment of the present invention includes a display panel 300 including a display area DA, which is in an unfolded state, and a peripheral area PA disposed around the outside of the display area DA.

The display area DA is an area displaying an image according to an input image signal, and includes a plurality of pixels PX and a plurality of signal lines. The plurality of signal lines may include a gate line transmitting a gate signal and a data line transmitting a data signal.

The pixel PX is a basic unit for displaying an image, and each pixel PX may include a pixel circuit including at least one transistor and a display part for displaying light of the image.

Referring to FIG. 2, the display panel 300 may include a substrate 110 including an insulating material, and at least one insulating layer 120 disposed on the substrate 110.

A pixel circuit 130 including at least one transistor may be disposed on the insulating layer 120, and at least one insulating layer 140 may be disposed on the pixel circuit 130.

The light emitting element ED may be disposed on the insulating layer 140. The light emitting element ED may include a light emitting layer 370, and a pixel electrode 191 and a common electrode 271 facing each other with the light emitting layer 370 therebetween. The light emitting element ED may be a light emitting diode.

The pixel electrode 191 may be electrically connected to a transistor of the pixel circuit 130 directly, or it may be electrically connected to the transistor of the pixel circuit 130 indirectly through another electric element.

An insulating layer 350, which may include an organic insulating material, may be disposed between the light emitting layer 370 and the insulating layer 140. The insulating layer 350 may have an opening exposing the pixel electrode 191, and the light emitting layer 370 may contact the pixel electrode 191 within the opening of the insulating layer 350.

The light emitting layer 370 may include an organic light emitting material or an inorganic light emitting material.

At least one insulating layer 360 may be disposed on the light emitting element ED.

At least one light emitting element ED may be disposed in the display part of each pixel PX to emit light toward the front of the display device 1000.

The peripheral area PA may be an area that does not mostly display an image, and may be an area adjacent to the display area DA. For example, the peripheral area PA may surround the display area DA. The peripheral area PA that does not display an image is called a dead space.

A voltage line, a driving signal line, a driving circuit, and the like may be disposed in the peripheral area PA.

Referring to FIG. 1, the display device 1000 according to the embodiment of the present invention may include at least one flexible printed circuit board (FPCB) 510, a first printed circuit board (PCB) 520, at least one second flexible circuit board 610, and a second circuit board (PCB) 620, which are electrically connected to the display panel 300.

The at least one first flexible circuit board 510 may be attached to one side peripheral area PA (for example, a lower side peripheral area PA) of the display panel 300 to be electrically connected to the display panel 300. At least one driving circuit chip 500 may be mounted on each first flexible circuit board 510.

The first flexible circuit board 510 may be attached and electrically connected to the first circuit board 520. Accordingly, the first circuit board 520 may be electrically connected to the lower side of the display panel 300 through at least one first flexible circuit board 510. The first circuit board 520 may transmit various driving voltages, driving signals, and data signals to the display panel 300 through the driving circuit chip 500.

The first circuit board 520 may include a connecting part 530.

The at least one second flexible circuit board 610 may be attached to the other side peripheral area PA (for example, an upper side peripheral area PA) of the display panel 300 to be electrically connected to the display panel 300. The second flexible circuit board 610 may be attached and electrically connected to the second circuit board 620. Accordingly, the second circuit board 620 may be electrically connected to the upper side of the display panel 300 through at least one second flexible circuit board 610.

The second circuit board 620 may be electrically connected to the first circuit board 520 disposed below to receive various driving voltages, driving signals, and data signals. For example, the second circuit board 620 may be electrically connected to the first circuit board 520 disposed below to receive various driving voltages. The driving voltage may be applied to the transistor of the pixel circuit 130 of the pixel PX described above to enable the light emitting element ED to emit light.

The second circuit board 620 may include a connecting part 630.

In some embodiments, the second circuit board 620 may be omitted. In this case, the second flexible circuit board 610 may be electrically connected to the first circuit board 520 disposed below to receive various driving voltages, driving signals, and data signals.

The first flexible circuit board 510 and the second flexible circuit board 610 may be bent toward a rear surface of the display panel 300 to be fixed on the rear surface of the display panel 300.

FIG. 3 illustrates a rear surface of the display device in a state in which the first flexible circuit board 510 and the second flexible circuit board 610 are bent to the rear surface of the display panel 300.

A support plate 200 may be disposed on the rear surface of the display device 1000. The support plate 200 may include a metal such as steel use stainless (SUS), and in this case, may also be referred to as a metal plate. The support plate 200 may have lower flexibility than the display panel 300. In an embodiment, the support plate 200 may be rigid. The support plate 200 may function for heat radiation, impact resistance, or the like for the display panel 300. The first circuit board 520 and the second circuit board 620 may be disposed on the rear surface of the support plate 200 to be fixed on the support plate 200.

The display device 1000 according to the embodiment of the present invention includes a third flexible circuit board 400 that may electrically connect the second circuit board 620 disposed at an upper side thereof to the first circuit board 520 disposed at a lower side thereof.

One end (i.e., a first side) of the third flexible circuit board 400 may be electrically connected to the connecting part 530 of the first circuit board 520, and the other end (i.e., a second side) of the third flexible circuit board 400 may be electrically connected to the connecting part 630 of the second circuit board 620. The first side and the second side may be opposite to each other.

Referring to FIG. 1 and FIG. 3, the display panel 300 of the display device 1000 according to the embodiment may have a long shape in one direction, for example, a first direction DR1 in a plan view. For example, a length of the first direction DR1 of the display panel 300 may be longer than a length of a second direction DR2. The display panel 300 may be folded inward based on a folding line FL extending in a direction substantially parallel to the second direction DR2. The display area DA of the folded display panel 300 may be divided into two portions to face each other and overlap each other. For example, when the display panel 300 is folded, the display area DA is folded inward so that the two portions of the display area DA face each other.

Referring to FIG. 3, the third flexible circuit board 400 may substantially extend long in the first direction DR1, and include a portion that crosses the folding line FL.

The support plate 200 may be provided with a folding opening 250 that overlaps the folding line FL and extends in parallel to the folding line FL. In an embodiment, the support plate 200 may be separated into two portions based on the folding opening 250. For example, the folding opening 250 may extend in the second direction along the folding line FL, thus dividing the support plate 200 into the two portions.

Figure 4:
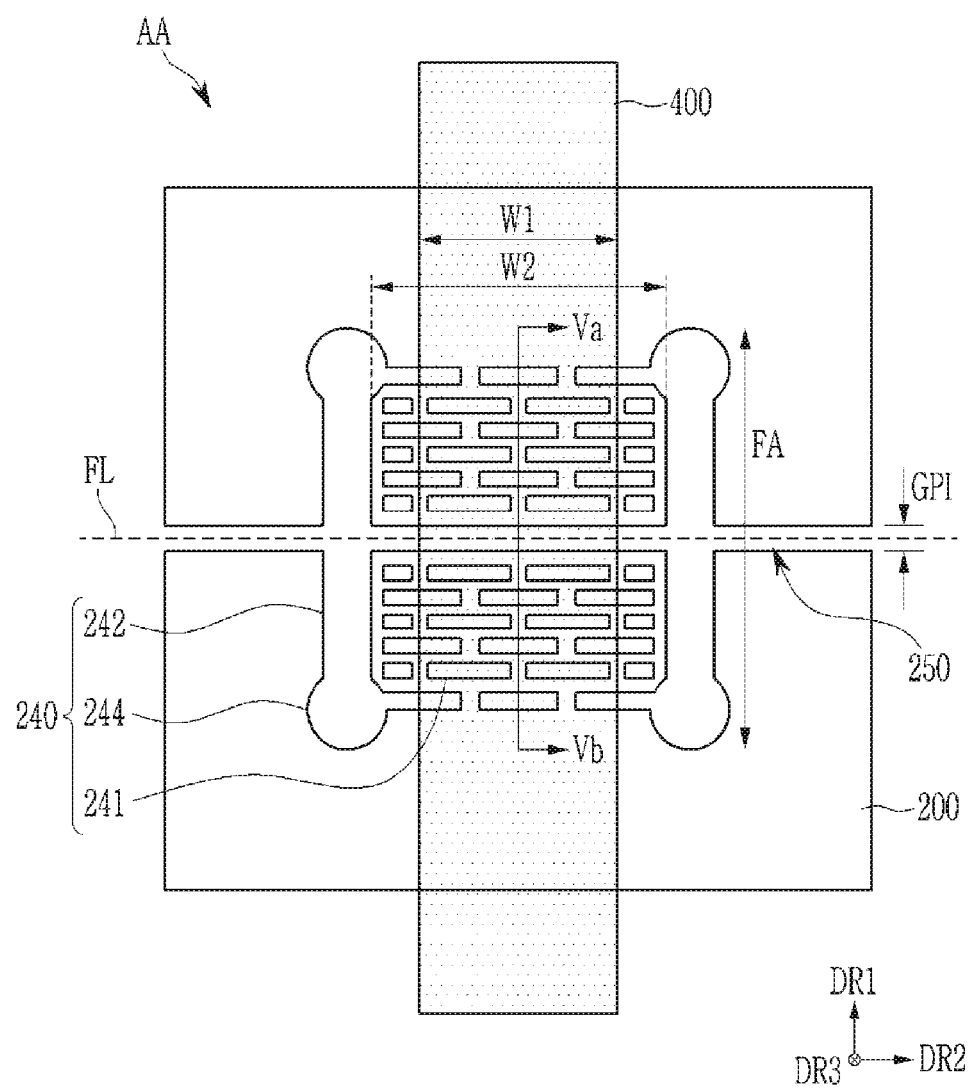
FIG. 4 illustrates an enlarged view of portion AA illustrated in FIG. 3 according to an exemplary embodiment of the present invention.
Figure 5:
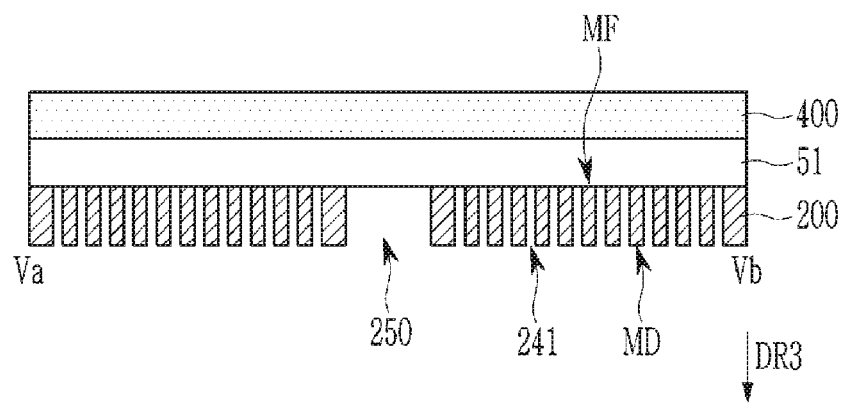
FIG. 5 illustrates a cross-sectional view taken along line Va-Vb of a portion of the display device illustrated in FIG. 4 according to an exemplary embodiment of the present invention.

FIG. 4 illustrates an enlarged view of portion AA illustrated in FIG. 3, and FIG. 5 illustrates a cross-sectional view taken along line Va-Vb of a portion of the display device shown in FIG. 4.

Referring to FIG. 4 and FIG. 5, in an area in which the third flexible circuit board 400 and the folding line FL cross each other, the support plate 200 may include a pattern area FA in which a part thereof is removed.

The pattern area FA of the support plate 200 may be provided with an opening pattern 240. The opening pattern 240 may include a plurality of slits 241 arranged substantially parallel to the first direction DR1. Each slit 241 may have a shape substantially extending long in the second direction DR2. In an embodiment, each slit 241 may extend in parallel to the folding line FL. The plurality of slits 241 arranged in the first direction DR1 may be spaced apart from each other so that the support plate 200 may be integrated with the pattern area FA.

The opening pattern 240 may further include a vertical opening 242 disposed at left and right edges of the pattern area FA and substantially extending in the first direction DR1. A width of the second direction DR2 of the vertical opening 242 may be greater than that of the first direction DR1 of each slit 241, but the present invention is not limited thereto. In an embodiment, the plurality of slits 241 may be disposed between two vertical openings 242 opposite to each other. A lengthwise direction of the opening pattern 240 is in parallel to the first direction DR1, and a lengthwise direction of each of the plurality of slits 241 is in parallel to the second direction DR2.

The opening pattern 240 may further include an opening 244 disposed at upper and lower end portions of the vertical opening 242. The opening 244 may have various shapes such as a circle and an ellipse, and may have a larger width than the width of the second direction DR2 of the vertical opening 242.

In an embodiment, the opening pattern 240 may be positioned near a portion of the folding opening 250 which is overlapped with the third flexible circuit board 400. The opening pattern 240 may be symmetric in the first direction with respect to the folding opening 250.

The third flexible circuit board 400 may overlap the pattern area FA of the support plate 200. In an embodiment, the third flexible circuit board 400 may overlap the opening pattern 240 of the pattern area FA. For example, the third flexible circuit board 400 may overlap the plurality of slits 241 between the vertical openings 242 of the opening pattern 240 opposite to each other.

A width W1 of the second direction DR2 of the third flexible circuit board 400 may be smaller than or equal to a width W2 of the second direction DR2 of the pattern area FA in which the plurality of slits 241 are disposed. A distance between one edge of the third flexible circuit board 400 and the vertical opening 242 of the opening pattern 240 adjacent thereto may be zero or more. In an embodiment, the opposite edges of the third flexible circuit board 400 may be spaced apart from the vertical opening 242 of the adjacent opening pattern 240. In an embodiment, the third flexible circuit board 400 does not overlap the opening pattern 240.

The two portions of the support plate 200 divided by the folding opening 250 of the support plate 200 may be spaced apart from each other by a width GP1 of the first direction of the folding opening 250. The width GP1 may be a width between about 0.5 mm and 1 mm, but is not limited thereto.

Referring to FIG. 5, an adhesive layer 51 such as a pressure-sensitive adhesive (PSA) may be disposed between the third flexible circuit board 400 and the support plate 200. A surface of the support plate 200 attached to the adhesive layer 51 is called a rear surface MF of the support plate 200, and an opposite surface thereof is called a front surface MD of the support plate 200. The front surface MD of the support plate 200 may be a surface facing the display panel 300. For example, the front surface MD of the support plate 200 may face the rear surface of the display device 1000.

Figure 6:
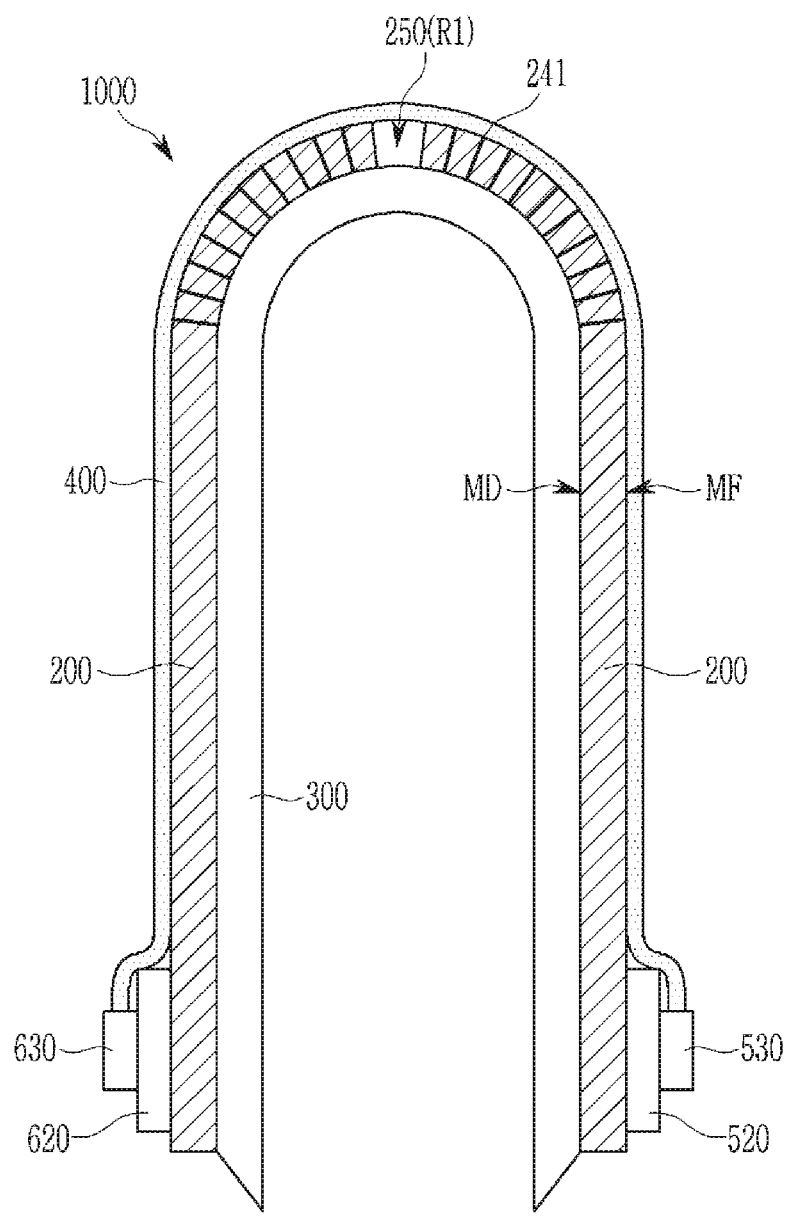
FIG. 6 illustrates a cross-sectional view taken along line R1 of FIG. 3 in a folded state of a display device according to an exemplary embodiment of the present invention.
Figure 7:
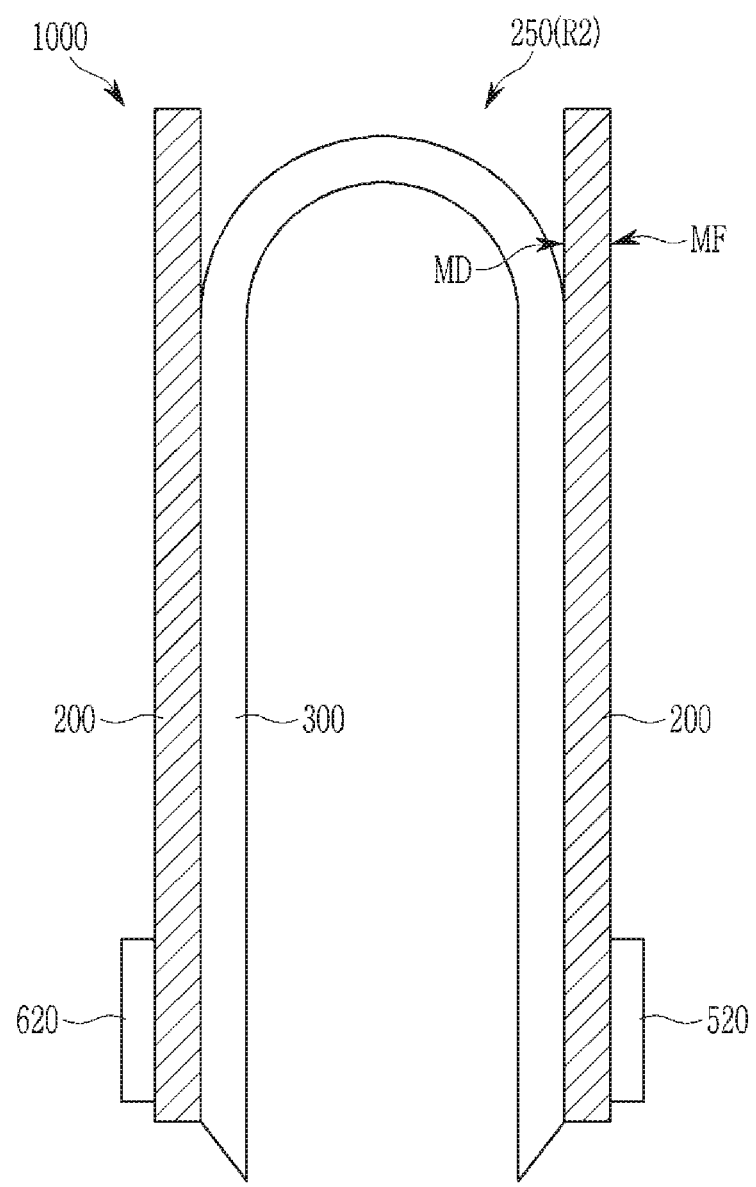
FIG. 7 illustrates a cross-sectional view taken along line R2 of FIG. 3 in a folded state of a display device according to an exemplary embodiment of the present invention.

FIG. 6 illustrates a cross-sectional view taken along line R1 of FIG. 3 in a folded state of the display device 1000 according to an embodiment of the present invention, and FIG. 7 illustrates a cross-sectional view taken along line R2 of FIG. 3 in a folded state of the display device 1000 according to an embodiment of the present invention.

Referring to FIG. 6 and FIG. 7, when the display device 1000 according to the embodiment of the present invention is folded along the folding line FL, in a portion corresponding to the line R2 of FIG. 3 in which the third flexible circuit board 400 is not disposed, the display device 1000 may be folded so that the two portions of the separated support plate 200 with the folding opening 250 therebetween overlap each other while facing each other.

In the portion corresponding to the line R1 of FIG. 3 in which the third flexible circuit board 400 is disposed, the support plate 200 including the plurality of slits 241 may be folded with relatively small stress. For example, the support plate 200 may have the plurality of slits 241 at a region where the third flexible circuit board 400 overlap the folding opening 250. The plurality of slits 241 may be arranged so that the third flexible circuit board 400 is folded with a gradually changing curvature. Therefore, it is possible to prevent a defect from occurring in the third flexible circuit board 400 due to the folding of the display device 1000.

Since the third flexible circuit board 400 is adhered to the support plate 200 through the adhesive layer 51, when the display device 1000 is folded along the folding line FL, the third flexible circuit board 400 may be pushed along a surface thereof facing the support plate 200. Therefore, it is possible to reduce influence and stress caused by the folded support plate 200 to be applied to the third flexible circuit board 400.

Since the third flexible circuit board 400 is adhered to the support plate 200 through the adhesive layer 51, when the display device 1000 is folded and then unfolded, the third flexible circuit board 400 is loosely lifted up near the folding line FL, and thus it is possible to prevent the third flexible circuit board 400 from being touched to a set or the like of the display device or being damaged.

When the support plate 200 is not patterned in the pattern area FA as in the embodiment of the present invention and the pattern area FA is entirely removed from the support plate 200, the portion in which the pattern area FA of the support plate 200 is removed may be viewed. However, according to the embodiment of the present invention, since the pattern area FA of the support plate 200 includes the plurality of slits 241 and since portions between the slits 241 remain, it is possible to minimize it to be viewed from the outside.

The opening 244 disposed at the edge of the opening pattern 240 of the support plate 200 may prevent damage to the support plate 200 due to concentration of stress at an end portion of the vertical opening 242 when the display device 1000 is folded.

Hereinafter, a display device according to an embodiment of the present invention will be described with reference to FIG. 8 together with the drawings described above.

Figure 8:
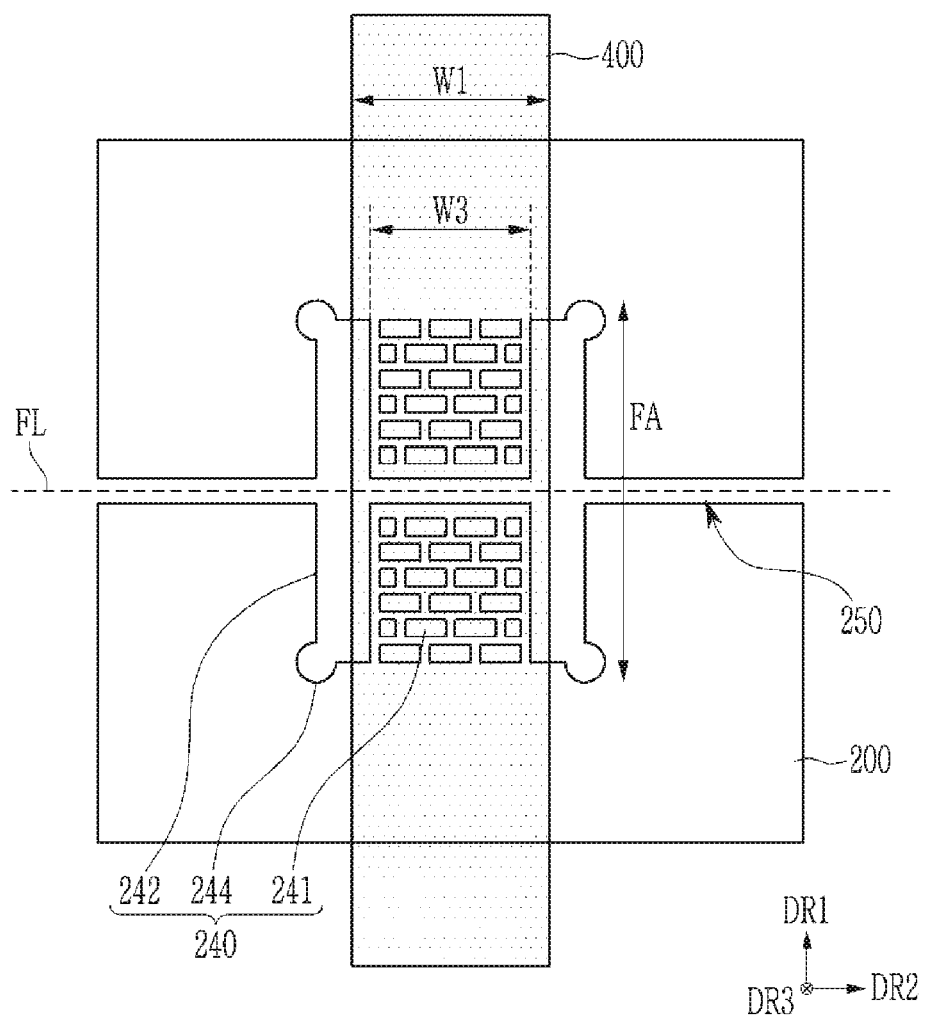
FIG. 8 and FIG. 9 respectively illustrate a planar layout view of a portion of a rear surface of a display device according to an exemplary embodiment of the present invention.

FIG. 8 illustrates a planar layout view of a portion of a rear surface of a display device according to an embodiment of the present invention.

Referring to FIG. 8, the display device according to the present embodiment is mostly the same as the display device 1000 described above, except for the pattern area FA of the support plate 200 in the area in which the third flexible circuit board 400 crosses the folding line FL.

A width of the second direction DR2 of the pattern area FA according to the present embodiment may be smaller than that of the second direction DR2 of the pattern area FA shown in FIG. 4.

Specifically, in the present embodiment, a width W1 of the third flexible circuit board 400 may be greater than a width W3 of the second direction DR2 of the pattern area FA in which the plurality of slits 241 are disposed. For example, opposite edges of the third flexible circuit board 400 may overlap the vertical opening 242 of the opening pattern 240.

According to the present embodiment, when compared to the embodiment illustrated in FIG. 4 described above, the third flexible circuit board 400 may be less stressed when the display device is folded.

Hereinafter, a display device according to an embodiment of the present invention will be described with reference and FIG. 9 and FIG. 10 together with the drawings described above.

Figure 9:
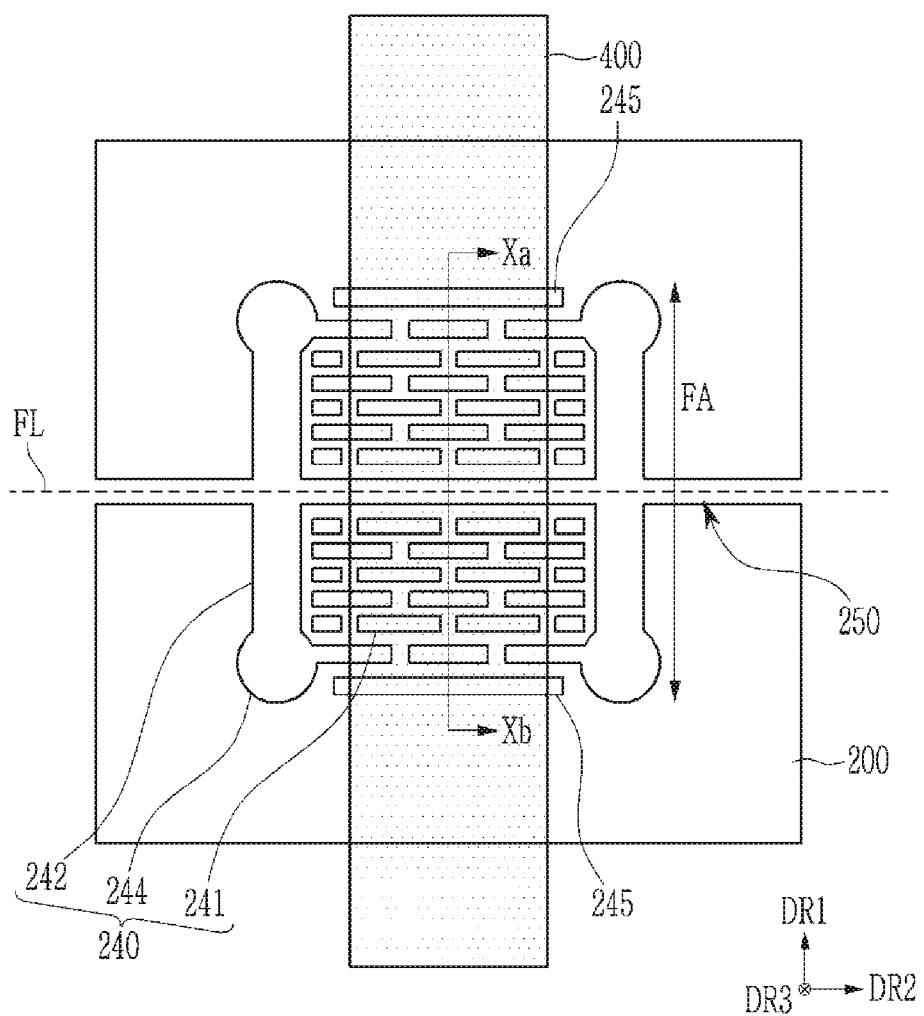
Figure 10:
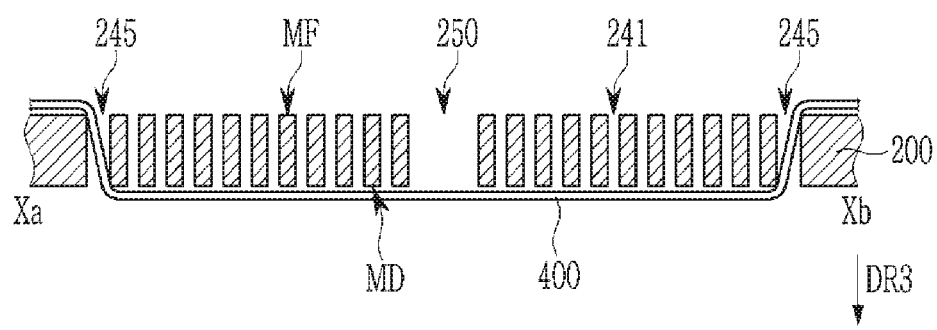
FIG. 10 illustrates a cross-sectional view taken along line Xa-Xb of a portion of the display device illustrated in FIG. 9 according to an exemplary embodiment of the present invention.

FIG. 9 illustrates a planar layout view of a portion of a rear surface of a display device according to an embodiment of the present invention, and FIG. 10 illustrates a cross-sectional view taken along line Xa-Xb of a portion of the display device shown in FIG. 9.

Referring to FIG. 9 and FIG. 10, the display device according to the present embodiment is mostly the same as the display device 1000 described above, except that the support plate 200 according to the present embodiment may further include a pair of horizontal openings 245.

The pair of horizontal openings 245 may be disposed near upper and lower edges of the pattern area FA, or may be disposed to be separated at a distance from the upper and lower edges thereof in the first direction DR1.

A width of the second direction DR2 of each horizontal opening 245 may be greater than that of the second direction DR2 of the third flexible circuit board 400.

The third flexible circuit board 400 may include a first portion disposed on a rear surface MF of the support plate 200 in an area other than the pattern area FA of the support plate 200, and may pass through the horizontal opening 245 of the support plate 200 from the rear surface MF toward a front surface MD of the support plate 200 so that a second portion of the third flexible circuit board 400 is disposed on the front surface MD of the support plate 200 in the pattern area FA of the support plate 200.

Unlike the embodiment shown in FIG. 9 and FIG. 10, the horizontal opening 245 may be disposed at a position spaced apart from the pattern area FA in the first direction DR1. Even in this case, the third flexible circuit board 400 may include a first portion disposed on the rear side MF of the support plate 200 and a second portion disposed on the front side MD of the support plate 200 through the horizontal opening 245. The third flexible circuit board 400 disposed on the front surface MD of the support plate 200 may overlap the pattern area FA of the support plate 200.

According to the present embodiment, since the third flexible circuit board 400 is disposed between the support plate 200 and the display panel near the folding line FL where the display device is folded, it may be disposed closer to the inside of the display device, thereby being disposed close to a neutral plane of the folded display device. Therefore, the stress of the third flexible circuit board 400 generated when the display device is folded may be further reduced.

Hereinafter, a display device according to an embodiment of the present invention will be described with reference to FIG. 11 to FIG. 14 together with the drawings described above.

Figure 11:
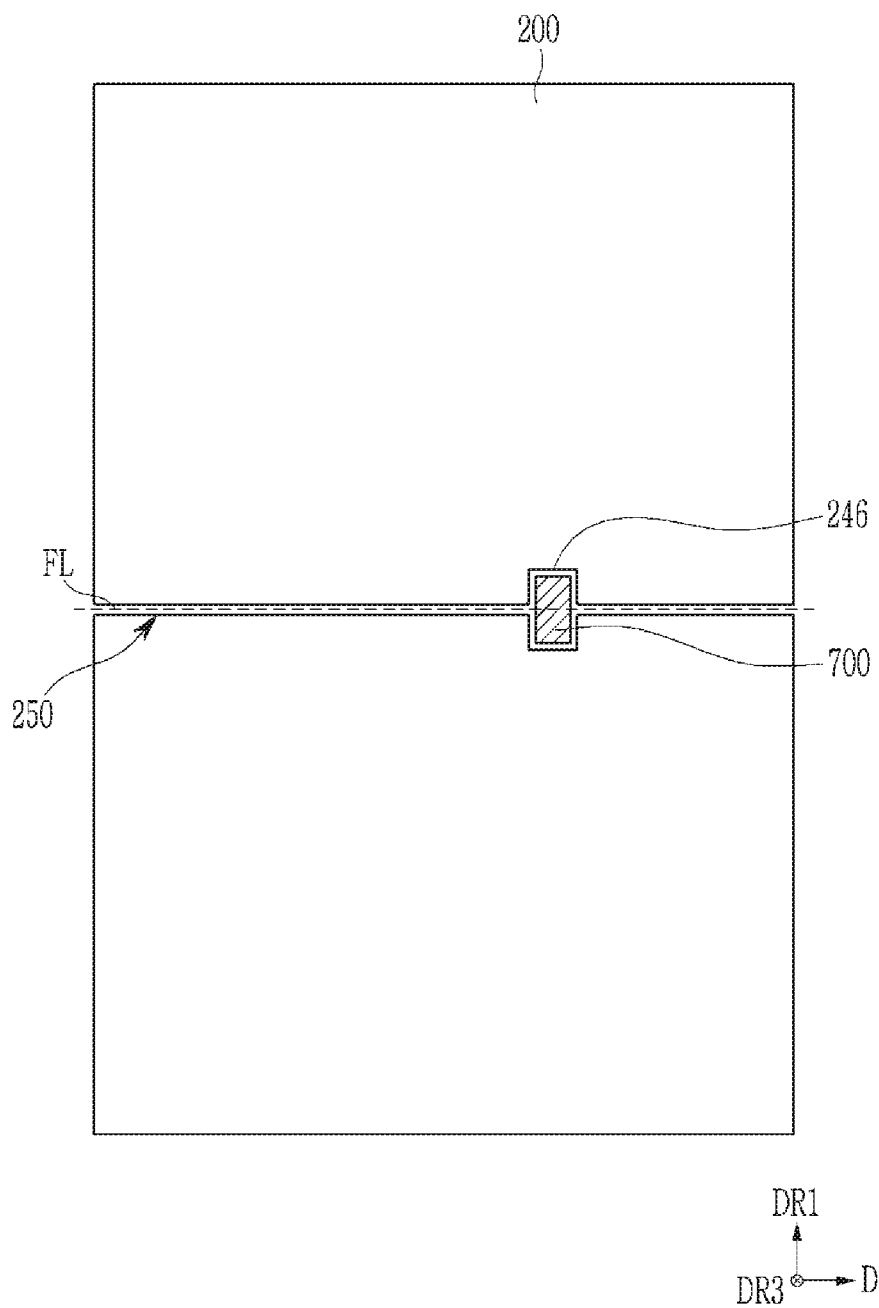
FIG. 11 and FIG. 12 respectively illustrate a planar layout view of a rear surface of a display device in an unfolded state of the display device according to an exemplary embodiment of the present invention.
Figure 12:
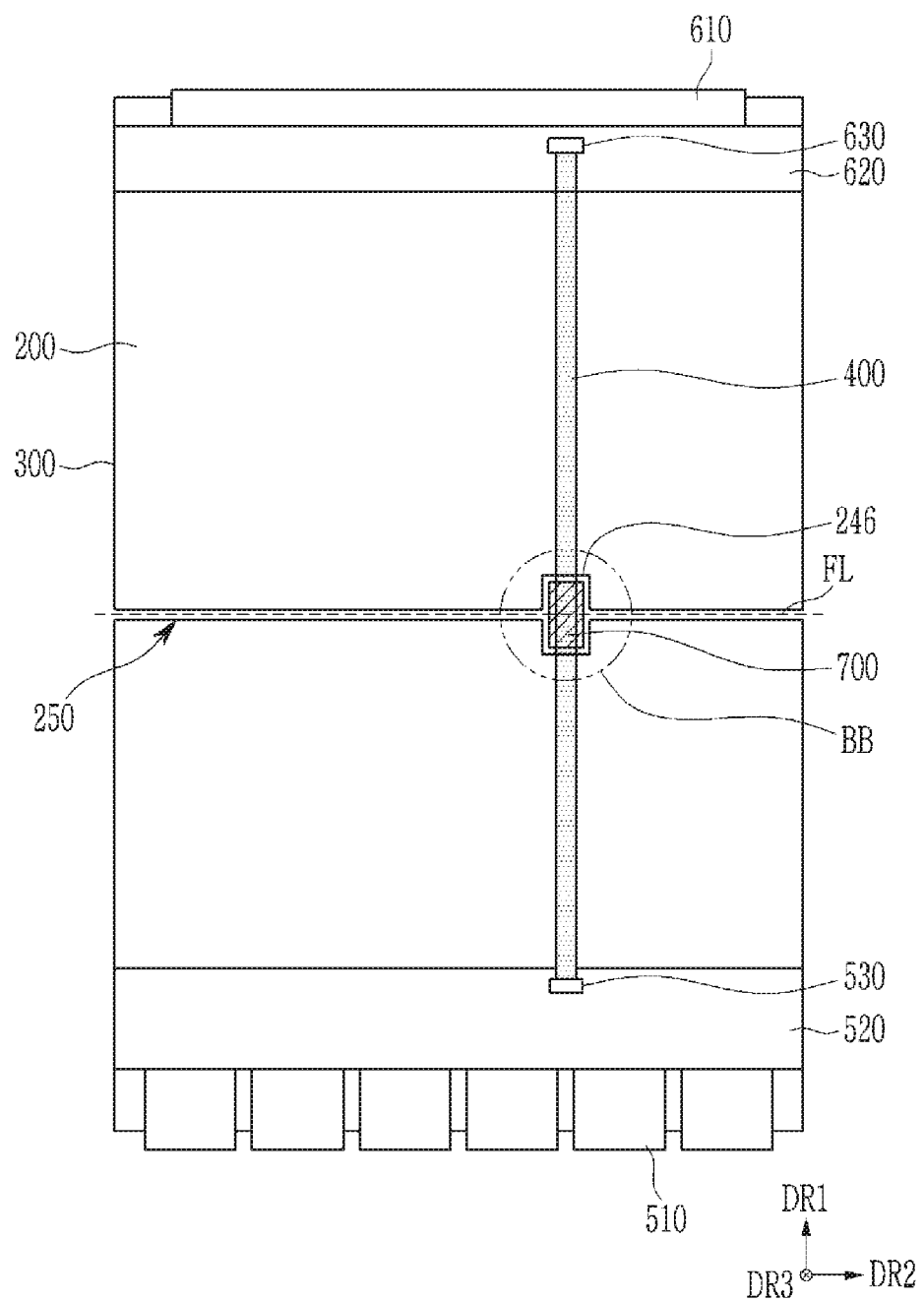
Figure 13:
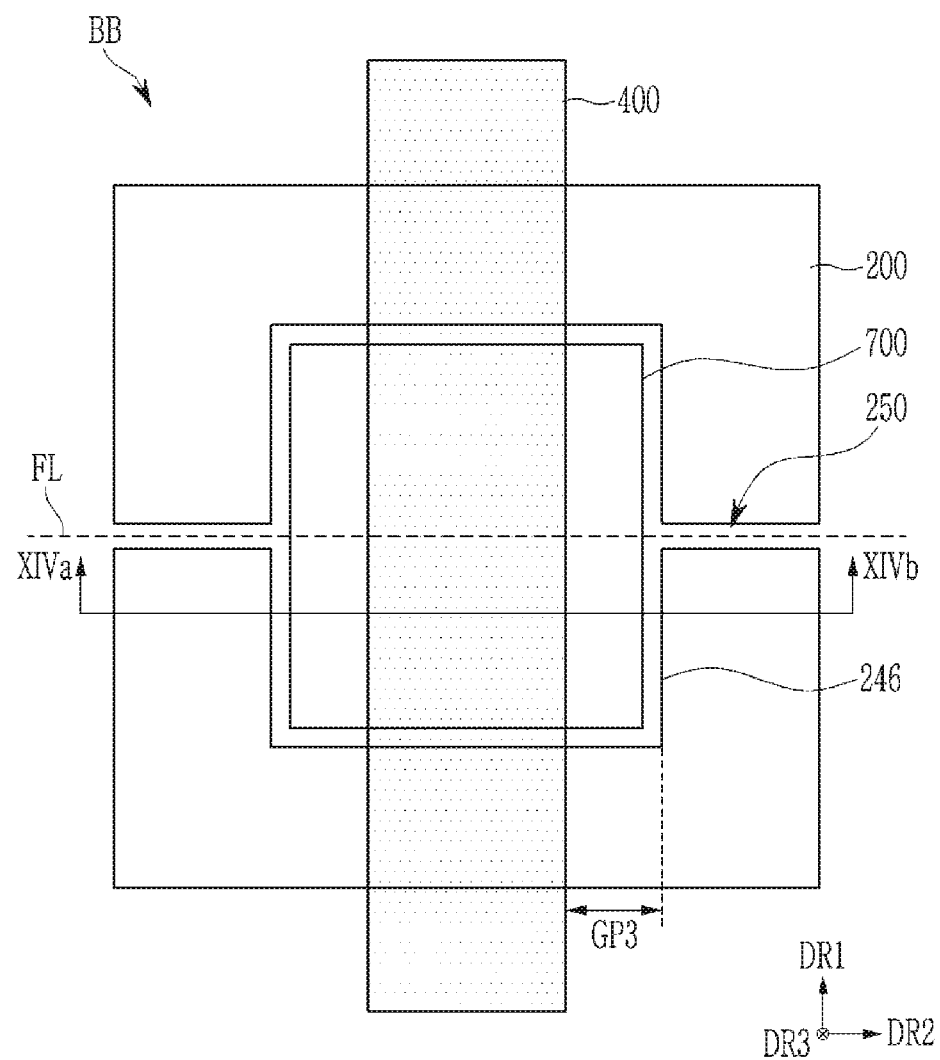
FIG. 13 illustrates an enlarged view of portion BB illustrated in FIG. 12 according to an exemplary embodiment of the present invention.
Figure 14:
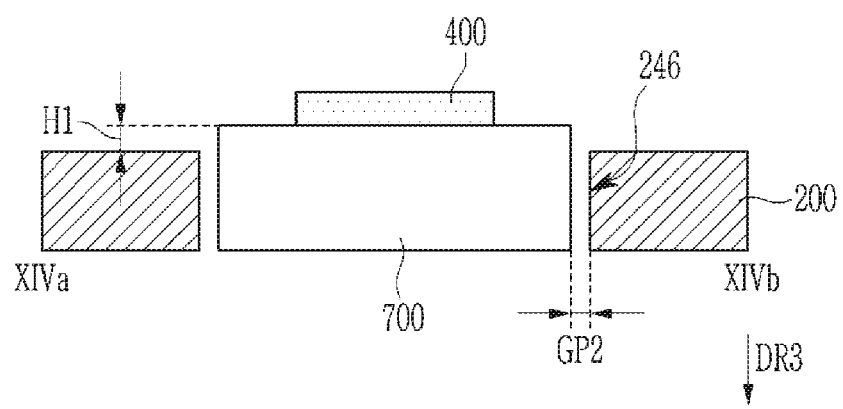
FIG. 14 illustrates a cross-sectional view taken along line XIVa-XIVb of a portion of the display device illustrated in FIG. 13 according to an exemplary embodiment of the present invention.

FIG. 11 and FIG. 12 illustrate a planar layout view of a rear surface of a display device in a unfolded state of the display device according to an embodiment of the present invention, FIG. 13 illustrates an enlarged view of portion BB illustrated in FIG. 12, and FIG. 14 illustrates a cross-sectional view taken along line XIVa-XIVb of a portion of the display device illustrated in FIG. 13.

The display device according to the present embodiment is mostly the same as the display device 1000 described above, except that the support plate 200 may be provided with an opening 246, instead of the pattern area FA described above, in the area in which the third flexible circuit board 400 crosses the folding line FL.

Referring to FIG. 11 and FIG. 12, the opening 246 of the support plate 200 may be combined with the folding opening 250 to form one continuous opening. For example, the opening 246 of the support plate 200 may be connected to the folding opening 250. The display device according to the present embodiment may further include a cushion 700 disposed in the opening 246 of the support plate 200. A material of the cushion 700 may be softer and have greater elasticity than that of the support plate 200, and may include sponge, foam, or urethane resin for example.

Referring to FIG. 14, when a surface of the cushion 700 facing the third flexible circuit board 400 is referred to as an upper surface of the cushion 700, the upper surface of the cushion 700 is higher than the support plate 200, and a step H1 between heights of the upper surface of the cushion 700 and the upper surface of the support plate 200 may be greater than zero. In an embodiment, the upper surface of the cushion 700 is higher than the rear side MF of the support plate 200 by the step H1. In an embodiment, a lower surface, opposite to the upper surface, of the cushion 700, and the front side MD of the support plate 200 may be positioned at the same height. The front side MD of the support plate 200 may be closer to the display panel 300 than the rear side MF of the support plate 200.

Referring to FIG. 13 and FIG. 14, a distance GP2 between the cushion 700 and the support plate 200 may be greater than 0, and a distance GP3 between an edge extending in the first direction DR1 of the third flexible circuit board 400 and an edge extending in the first direction DR1 among edges of the opening 246 adjacent thereto may be greater than the distance GP2 between the cushion 700 and the support plate 200.

An adhesive layer may be disposed on a bottom surface of the cushion 700 so that the bottom surface of the cushion 700 may be attached to an element therebelow.

The third flexible circuit board 400 may overlap the cushion 700 while passing an upper portion of the cushion 700 in an area crossing the folding line FL.

An adhesive layer may also be disposed between the third flexible circuit board 400 and the cushion 700.

According to the present embodiment, since the third flexible circuit board 400 passes above the cushion 700 having the upper surface that is higher than the support plate 200, when the display device is folded along the folding line FL, the third flexible circuit board 400 may be prevented from being damaged or stressed by colliding with the edge of the support plate 200.

When there is no cushion 700 in the opening 246 of the support plate 200, a portion of the opening 246 of the support plate 200 may be viewed from the outside, but according to the present embodiment, since the cushion 700 is disposed in the opening 246 of the support plate 200, it is possible to minimize the opening 246 being viewed from the outside. In an embodiment, as the distance GP2 between the cushion 700 and the support plate 200 is minimized, it is possible to further minimize the opening 246 of the support plate 200 being viewed from the outside.

Hereinafter, a display device according to an embodiment of the present invention will be described with reference to FIG. 15 to FIG. 20 together with the drawings described above.

Figure 15:
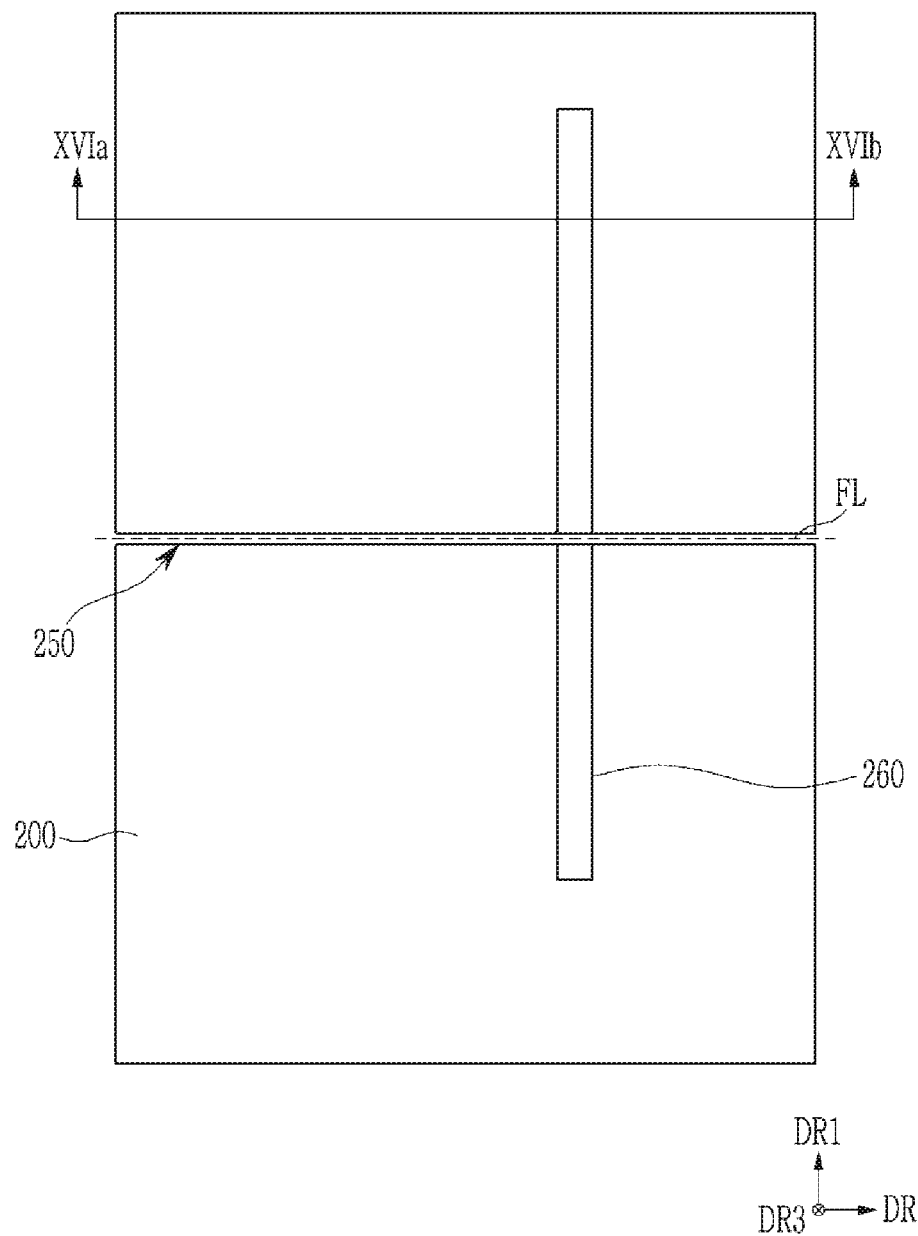
FIG. 15 and FIG. 17 respectively illustrate a planar layout view of a rear surface of a display device in an unfolded state of the display device according to an exemplary embodiment of the present invention.
Figure 16:
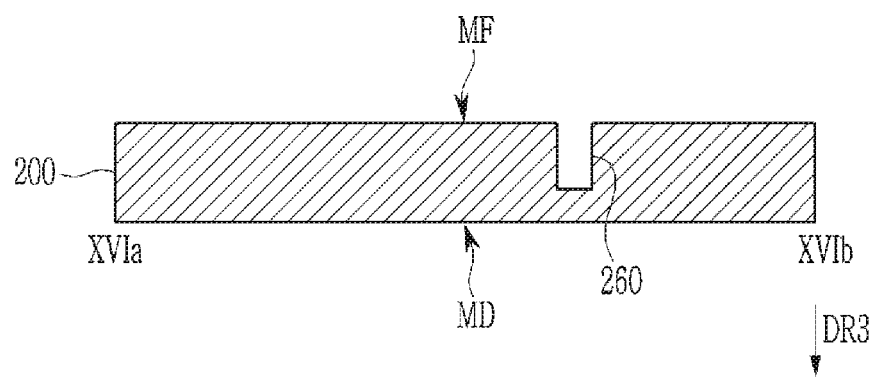
FIG. 16 illustrates a cross-sectional view taken along line XVIa-XVIb of the display device illustrated in FIG. 15 according to an exemplary embodiment of the present invention.
Figure 17:
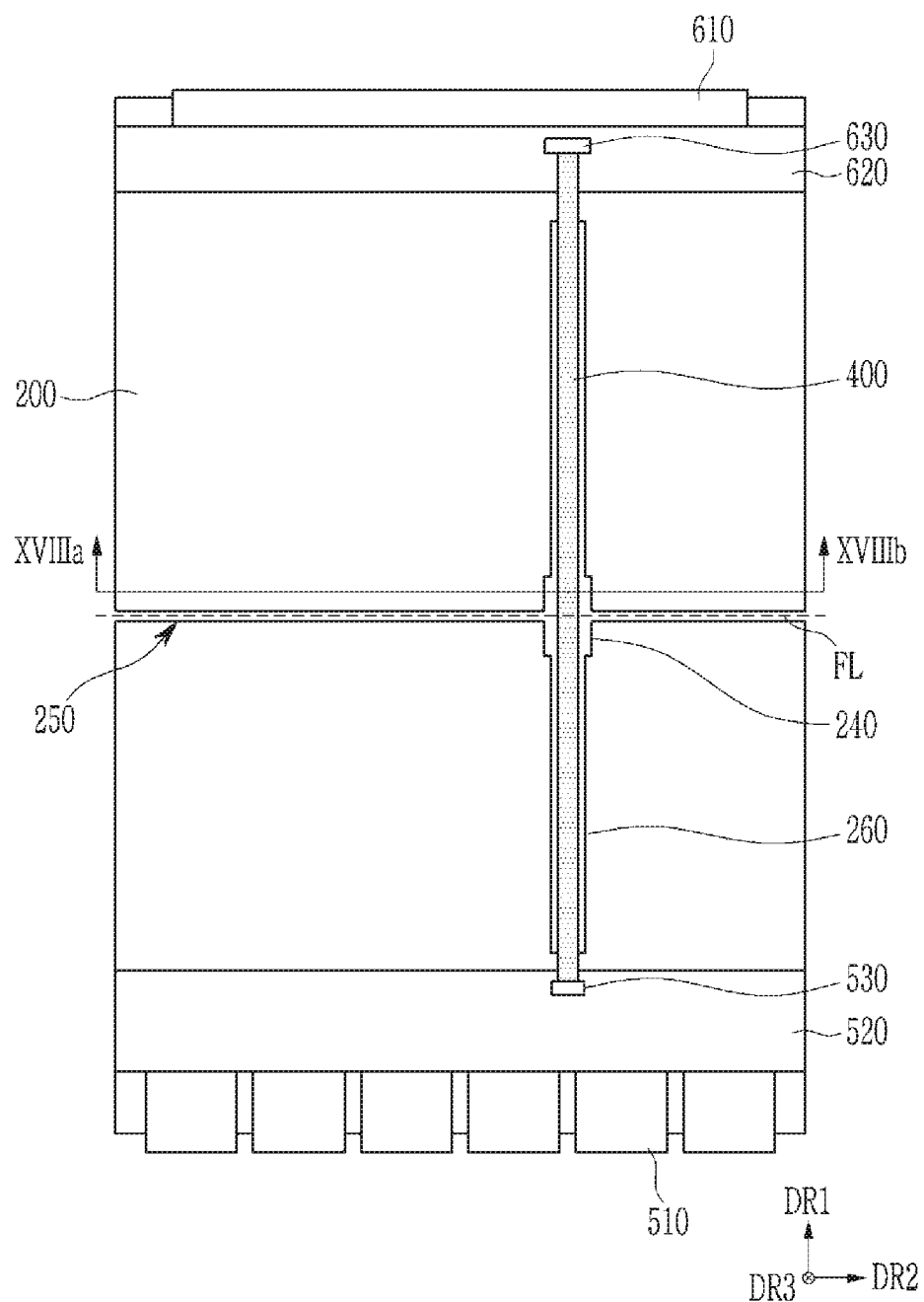
Figure 18:
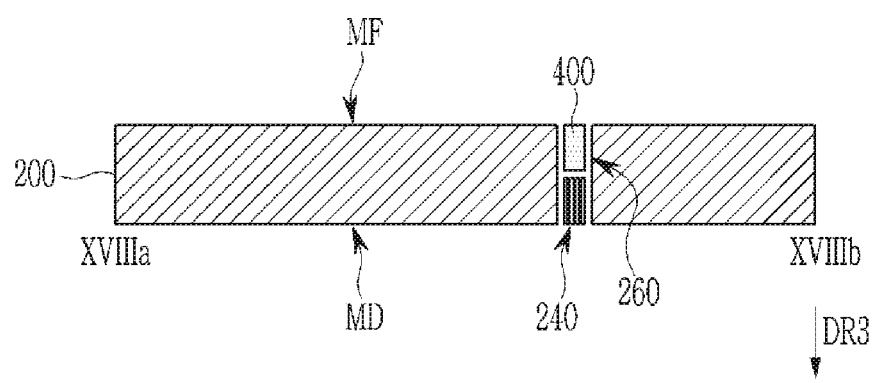
FIG. 18 illustrates a cross-sectional view taken along line XVIIIa-XVIIIb of the display device illustrated in FIG. 17 according to an exemplary embodiment of the present invention.
Figure 19:
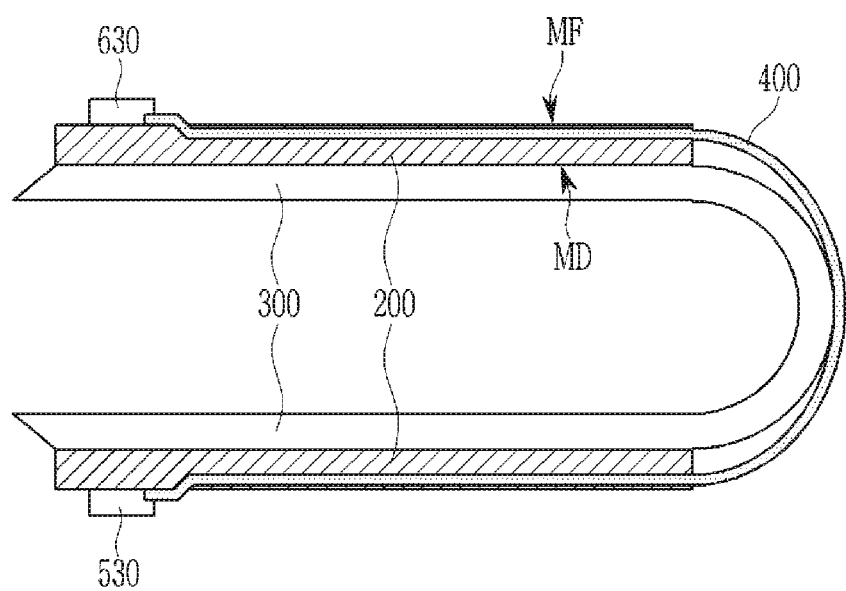
FIG. 19 illustrates a cross-sectional view in a folded state of the display device illustrated in FIG. 17 and FIG. 18 according to an exemplary embodiment of the present invention.
Figure 20:
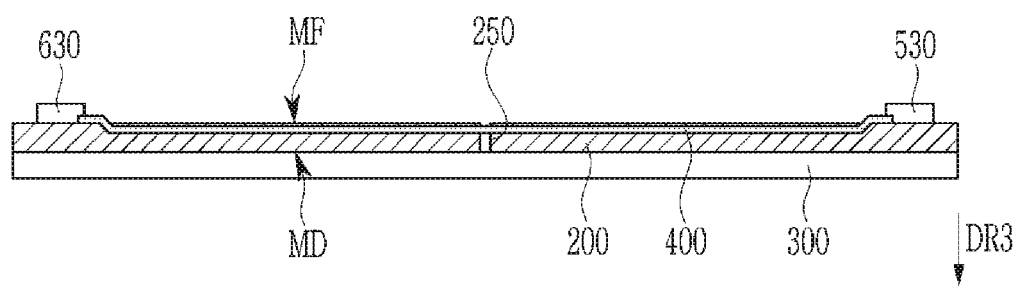
FIG. 20 illustrates a cross-sectional view in an unfolded state of the display device illustrated in FIG. 17 and FIG. 18 according to an exemplary embodiment of the present invention.

FIG. 15 and FIG. 17 illustrate a planar layout view of a rear surface of a display device in a unfolded state of the display device according to an embodiment of the present invention, FIG. 16 illustrates a cross-sectional view taken along line XVIa-XVIb of the display device illustrated in FIG. 15, FIG. 18 illustrates a cross-sectional view taken along line XVIIIa-XVIIIb of the display device illustrated in FIG. 17, FIG. 19 illustrates a cross-sectional view in a folded state of the display device illustrated in FIG. 17 and FIG. 18, and FIG. 20 illustrates a cross-sectional view in a unfolded state of the display device illustrated in FIG. 17 and FIG. 18.

The display device according to the present embodiment is mostly the same as the display device 1000 described above, except that the support plate 200 may be provided with a hole (or groove) 260 in which a portion of the rear surface MF is removed. Unlike the various openings described above, the hole 260 may be formed by removing a portion of the support plate 200 in a thickness direction thereof.

Referring to FIG. 15 and FIG. 17, the hole 260 of the support plate 200 may substantially extend in the first direction DR1, and may extend along an imaginary line extending in the first direction DR1 between the connecting part 530 of the first circuit board 520 and the connecting part 630 of the second circuit board 620.

Referring to FIG. 17 and FIG. 18, the third flexible circuit board 400 may be disposed in the hole 260 of the support plate 200.

An adhesive layer for fixing the third flexible circuit board 400 may be further disposed between the third flexible circuit board 400 and the rear surface MF of the support plate 200 in the hole 260.

The support plate 200 may have the opening pattern 240 disposed in a crossing area of the third flexible circuit board 400 and the folding line FL, as in the above-described embodiment. The opening pattern 240 may be disposed closer to the front surface MD of the support plate 200 as shown in FIG. 18, and may be adjacent to the hole 260 in the third direction DR3, that is, in a thickness direction of the support plate 200. In an embodiment, the opening pattern 240 may be connected to the hole 260.

Referring to FIG. 19, since the third flexible circuit board 400 is disposed in the hole 260 of the support plate 200, when the display device according to the present embodiment is folded, the third flexible circuit board 400 may be disposed closer to the inside of the display device. Accordingly, since the third flexible circuit board 400 may be disposed closer to the neutral plane of the folded display device, it is possible to further reduce the stress applied to the third flexible circuit board 400 when the display device is folded.

Referring to FIG. 20, even when the folded display device is unfolded, since the third flexible circuit board 400 is disposed in the hole 260 of the support plate 200 and is fixed to the support plate 200, the third flexible circuit board 400 is loosely lifted up near the folding line FL, and thus it is possible to prevent the third flexible circuit board 400 from being touched to a set or the like of the display device or being damaged.

Hereinafter, a display device according to an embodiment of the present invention will be described with reference to FIG. 21 to FIG. 26 together with the drawings described above.

Figure 21:
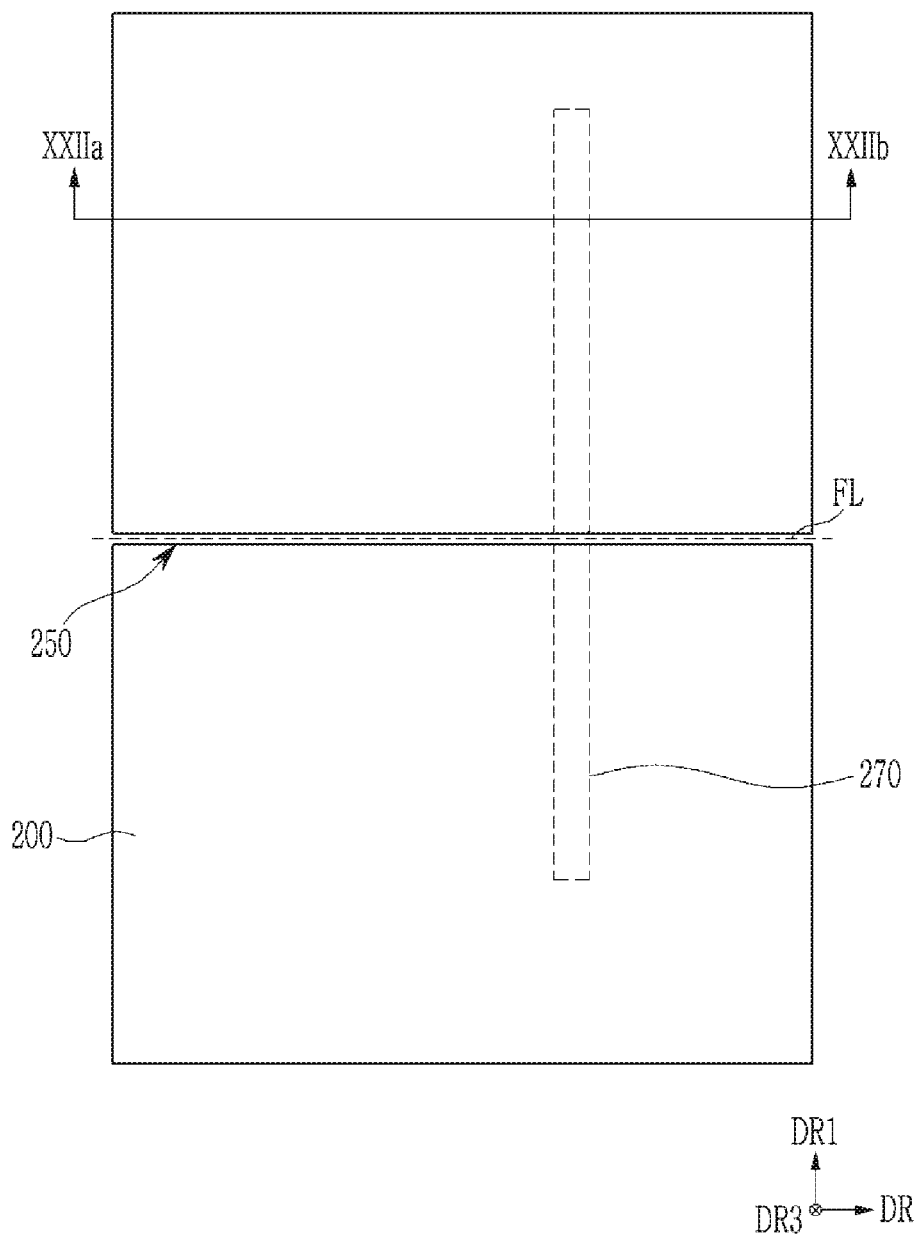
FIG. 21 and FIG. 23 respectively illustrate a planar layout view of a rear surface of a display device in an unfolded state of the display device according to an exemplary embodiment of the present invention.
Figure 22:
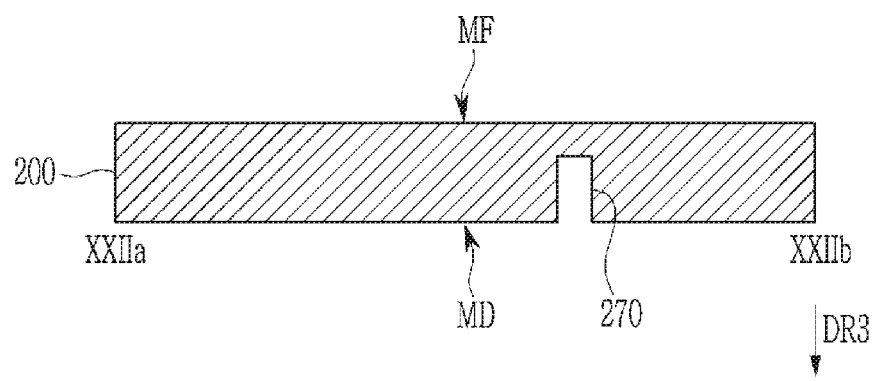
FIG. 22 illustrates a cross-sectional view of the display device taken along line XXIIa-XXIIb of the display device illustrated in FIG. 21 according to an exemplary embodiment of the present invention.
Figure 23:
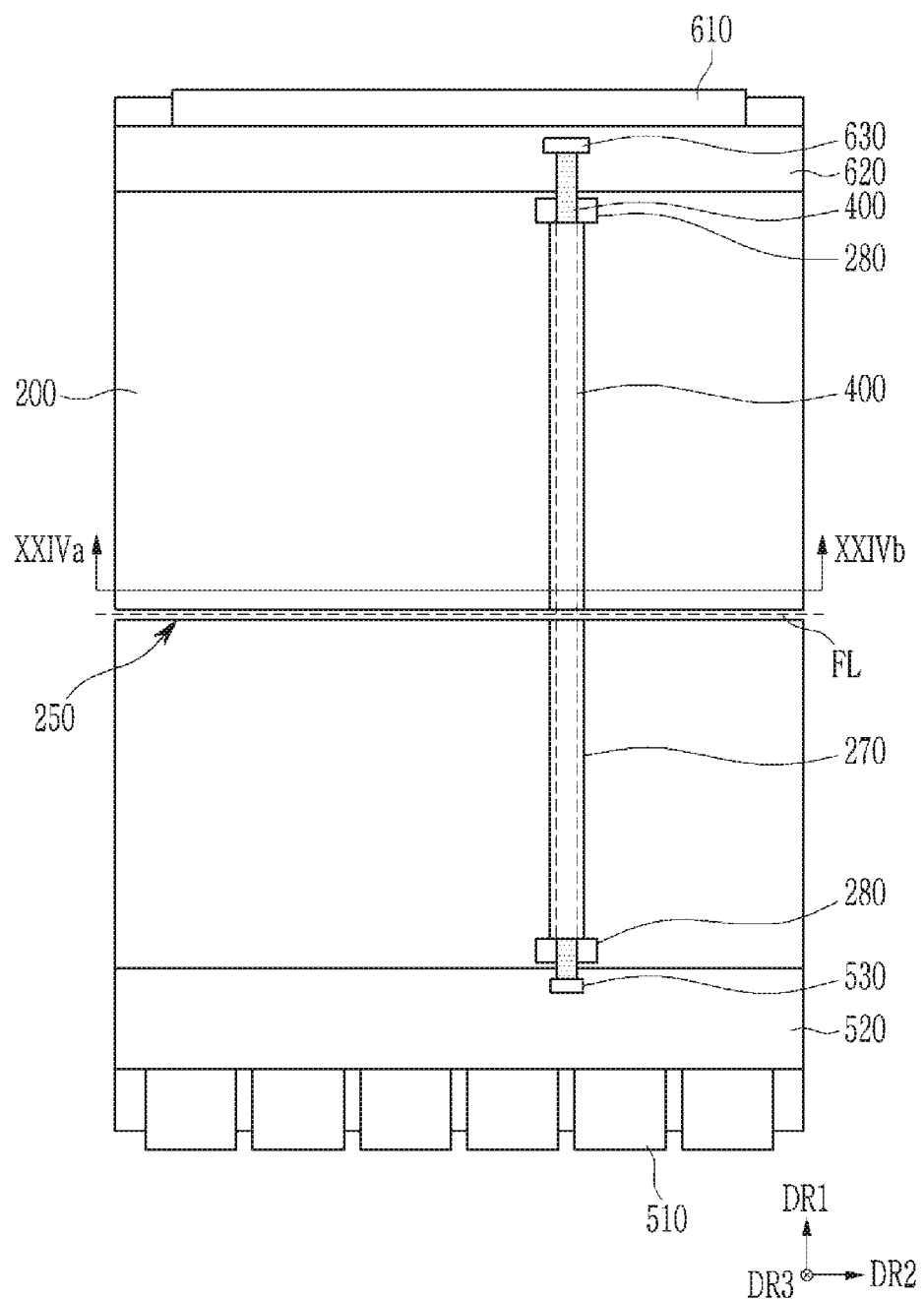
Figure 24:
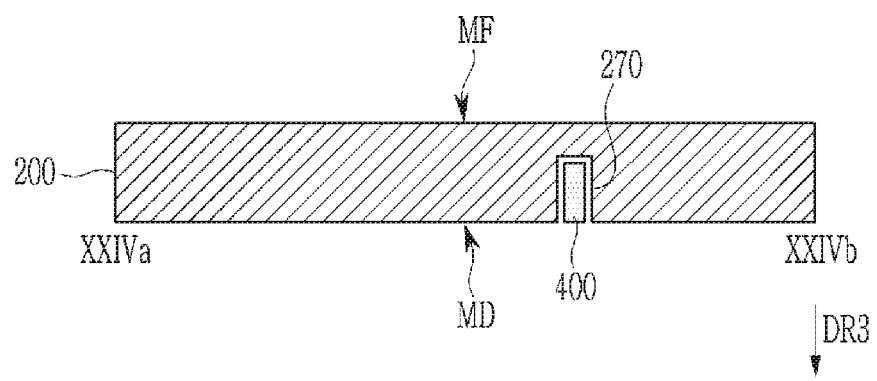
FIG. 24 illustrates a cross-sectional view of the display device taken along line XXIVa-XXIVb of the display device illustrated in FIG. 23 according to an exemplary embodiment of the present invention.
Figure 25:
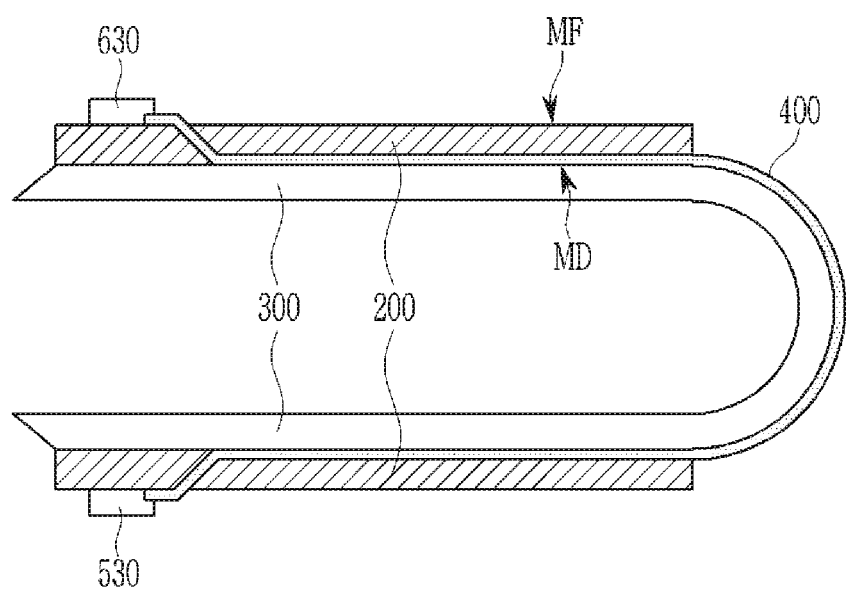
FIG. 25 illustrates a cross-sectional view in a folded state of the display device illustrated in FIG. 23 and FIG. 24 according to an exemplary embodiment of the present invention.
Figure 26:
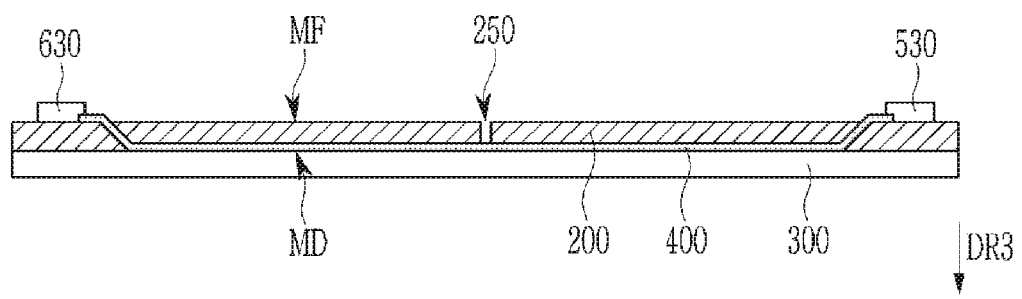
FIG. 26 illustrates a cross-sectional view in an unfolded state of the display device illustrated in FIG. 23 and FIG. 24 according to an exemplary embodiment of the present invention.

FIG. 21 and FIG. 23 illustrate a planar layout view of a rear surface of a display device in a unfolded state of the display device according to an embodiment of the present invention, FIG. 22 illustrates a cross-sectional view taken along line XXIIa-XXIIb of the display device illustrated in FIG. 21, FIG. 24 illustrates a cross-sectional view taken along line XXIVa-XXIVb of the display device illustrated in FIG. 23, FIG. 25 illustrates a cross-sectional view in a folded state of the display device illustrated in FIG. 23 and FIG. 24, and FIG. 26 illustrates a cross-sectional view in a unfolded state of the display device illustrated in FIG. 23 and FIG. 24.

The display device according to the present embodiment is mostly the same as the display device 1000 described above, except that the support plate 200 may be provided with a hole (or groove) 270 in which a portion of the front surface MD of the support plate 200 is removed.

Referring to FIG. 21 and FIG. 23, the hole 270 of the support plate 200 may substantially extend in the first direction DR1, and may overlap an imaginary line extending between the connecting part 530 of the first circuit board 520 and the connecting part 630 of the second circuit board 620 and may extend parallel thereto.

Referring to FIG. 23 and FIG. 24, the third flexible circuit board 400 may be disposed in the hole 270 of the support plate 200. An adhesive layer for fixing the third flexible circuit board 400 may be further disposed between the third flexible circuit board 400 and the front surface MD of the support plate 200 in the hole 270.

Referring to FIG. 23, the support plate 200 may further have an opening 280 disposed near upper and lower ends of the hole 270.

The third flexible circuit board 400 may be disposed at the rear surface MF of the support plate 200 in a portion connected to the connecting part 530 of the first circuit board 520 and the connecting part 630 of the second circuit board 620, may pass through the opening 280 of the support plate 200, and may be disposed at the front surface MD of the support plate 200 in an area overlapping the hole 270 of the support plate 200. That is, the third flexible circuit board 400 disposed at the front surface MD of the support plate 200 may cross the folding line FL.

Referring to FIG. 25, since the third flexible circuit board 400 crossing the folding line FL in which the display device is folded is disposed between the support plate 200 and the display panel 300, when the display device is folded, the third flexible circuit board 400 may be disposed closer to the inside of the display device. Accordingly, since the third flexible circuit board 400 may be disposed closer to the neutral plane of the folded display device, it is possible to further reduce the stress applied to the third flexible circuit board 400 when the display device is folded.

Referring to FIG. 26, since the third flexible circuit board 400 is disposed between the support plate 200 and the display panel 300, when the folded display device is unfolded, the third flexible circuit board 400 is loosely lifted up near the folding line FL, and thus it is possible to prevent the third flexible circuit board 400 from being touched to a set or the like of the display device or being damaged. In addition, since the third flexible circuit board 400 is disposed in the hole 270 of the support plate 200 and fixed to the support plate 200, the reliability of the third flexible circuit board 400 may be further increased.

A manufacturing process of the display device according to the embodiment illustrated in FIG. 21 to FIG. 26 may primarily include assembling the third flexible circuit board 400 into the hole 270 of the front surface MD of the support plate 200. In addition, the manufacturing process may include attaching the support plate 200 to the display panel 300, and then connecting opposite ends of the third flexible circuit board 400 to the connecting part 530 of the first circuit board 520 and the connecting part 630 of the second circuit board 620, respectively.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a display panel including a front surface and a rear surface opposite to each other;
    a first circuit board electrically connected to a first side of the display panel;
    a second circuit board electrically connected to a second side opposite to the first side of the display panel;
    a third circuit board disposed on the rear surface of the display panel and electrically connected to the first circuit board and the second circuit board, wherein the third circuit board extends in a first direction;
    a support plate disposed on the rear surface of the display panel,
    wherein the display panel is foldable along a folding line extending in a second direction crossing the first direction,
    wherein the support plate has a first opening extending along the folding line, and a second opening near a portion of the first opening, and
    wherein the third circuit board overlaps the portion of the first opening; and
    a cushion disposed in the second opening,
    wherein the third circuit board overlaps the cushion.

2. The display device of claim 1, wherein
    an upper surface of the cushion is higher than an upper surface of the support plate.

3. The display device of claim 2, wherein
    a distance of the second direction between an edge extending in the first direction of the third circuit board and a first edge extending in the first direction of the second opening is greater than a distance of the second direction between an edge extending in the first direction of the cushion and the first edge of the second opening of the support plate, and
    the edge of the third circuit board and the edge of the cushion are closer to the first edge of the second opening than a second edge, opposite to the first edge, of the second opening.

4. A display device comprising:
a display panel including a front surface and a rear surface opposite to each other;
a first circuit board electrically connected to a first side of the display panel;
a second circuit board electrically connected to a second side opposite to the first side of the display panel;
a third circuit board disposed on the rear surface of the display panel and electrically connected to the first circuit board and the second circuit board, wherein the third circuit board extends in a first direction; and
a support plate disposed on the rear surface of the display panel,
wherein the display panel is foldable along a folding line extending in a second direction crossing the first direction,
wherein the support plate includes a first surface and a second surface opposite to each other,
wherein the support plate has a hole formed on the first surface and extending in the first direction, and
wherein the third circuit board is disposed in the hole.

5. The display device of claim 4, wherein
the display panel is closer to the second surface of the support plate than the first surface of the support plate.

6. The display device of claim 4, wherein
the support plate has an opening disposed closer to the second surface of the support plate, and the opening of the support plate is adjacent to the hole of the support plate in a thickness direction of the support plate.

7. The display device of claim 6, wherein
the opening of the support plate is connected to the hole of the support plate, and
the third circuit board passes through the opening.

8. The display device of claim 7, wherein
the third circuit board disposed in the hole of the support plate crosses the folding line.

* * * * *